(12) United States Patent
Sakaguchi

(10) Patent No.: US 10,418,997 B2
(45) Date of Patent: Sep. 17, 2019

(54) LEVEL SHIFTER

(71) Applicant: SII Semiconductor Corporation, Chiba-shi, Chiba (JP)

(72) Inventor: Kaoru Sakaguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/826,170

(22) Filed: Nov. 29, 2017

(65) Prior Publication Data

US 2018/0226971 A1  Aug. 9, 2018

(30) Foreign Application Priority Data

Feb. 9, 2017  (JP) ................. 2017-022483

(51) Int. Cl.
*H03L 5/00* (2006.01)
*H03K 19/0185* (2006.01)

(52) U.S. Cl.
CPC .......................... *H03K 19/018521* (2013.01)

(58) Field of Classification Search
None
See application file for complete search history.

(56) References Cited

U.S. PATENT DOCUMENTS

| | | | | |
|---|---|---|---|---|
| 5,646,642 A * | 7/1997 | Maekawa | ........ | H03K 3/356017 326/62 |
| 6,268,755 B1 * | 7/2001 | Summerlin | ...... | H03K 19/00361 326/81 |
| 6,617,878 B2 * | 9/2003 | Brownlow | ....... | H03K 3/356113 326/62 |
| 7,196,547 B2 * | 3/2007 | Kozawa | ........... | H03K 3/356113 326/68 |
| 7,196,699 B1 * | 3/2007 | Kubota | ................. | G09G 3/3677 345/100 |
| 7,839,171 B1 * | 11/2010 | Miles | ...................... | H03K 3/011 326/63 |
| 9,257,973 B1 * | 2/2016 | Shay | ................. | H03K 3/356104 |
| 2006/0066349 A1 * | 3/2006 | Murakami | ............. | H03K 3/017 326/81 |
| 2006/0097769 A1 * | 5/2006 | Mizukami | ........ | H03K 3/356113 327/333 |

(Continued)

FOREIGN PATENT DOCUMENTS

JP  2001-036398 A  2/2001
JP  2013-187712 A  9/2013

*Primary Examiner* — Lincoln D Donovan
*Assistant Examiner* — Khareem E Almo
(74) *Attorney, Agent, or Firm* — Brinks Gilson & Lione

(57) ABSTRACT

Between a power supply potential and a reference potential, a first PMOS transistor and a first NMOS transistor are connected in series via an inverting output node and a second PMOS transistor and a second NMOS transistor are connected in series via a non-inverting output node. A third NMOS transistor is connected in parallel to the first NMOS transistor and a fourth NMOS transistor is connected in parallel to the second NMOS transistor. A gate of the first PMOS transistor and a gate of the third NMOS transistor are connected to the non-inverting output node and a gate of the second PMOS transistor and a gate of the fourth NMOS transistor are connected to the inverting output node. The first and second NMOS transistors receive a non-inverted signal and an inverted signal of an input signal at their gates, respectively.

8 Claims, 4 Drawing Sheets

(56) References Cited

U.S. PATENT DOCUMENTS

| | | | | |
|---|---|---|---|---|
| 2006/0220696 A1* | 10/2006 | Katou | H03K 3/35613 | 327/100 |
| 2006/0261851 A1* | 11/2006 | Kim | H03K 3/011 | 326/81 |
| 2007/0085566 A1* | 4/2007 | Koto | H03K 3/356104 | 326/80 |
| 2008/0191777 A1* | 8/2008 | Lee | H03K 3/012 | 327/333 |
| 2009/0174458 A1* | 7/2009 | Campbell | H03K 3/012 | 327/333 |
| 2009/0261885 A1* | 10/2009 | Wada | G06F 1/24 | 327/333 |
| 2010/0301900 A1* | 12/2010 | Deng | H03K 3/356113 | 326/81 |
| 2011/0128063 A1* | 6/2011 | Fukuda | H03K 3/356113 | 327/333 |
| 2012/0038611 A1* | 2/2012 | Otani | H03K 3/356165 | 345/211 |
| 2013/0162294 A1* | 6/2013 | Henmi | H03K 19/018507 | 326/80 |
| 2013/0222038 A1* | 8/2013 | Kuge | H03K 19/00369 | 327/333 |
| 2013/0342259 A1* | 12/2013 | Teraguchi | H03K 3/012 | 327/333 |
| 2014/0340136 A1* | 11/2014 | Teplechuk | H03K 3/35613 | 327/333 |
| 2015/0002206 A1* | 1/2015 | Nakamura | G11C 7/1039 | 327/333 |
| 2015/0078096 A1* | 3/2015 | Kawasaki | H03K 3/35613 | 365/185.23 |
| 2016/0094225 A1* | 3/2016 | Lim | H03K 19/017509 | 345/174 |
| 2016/0118985 A1* | 4/2016 | Zhou | H03K 3/356165 | 326/80 |
| 2016/0182023 A1* | 6/2016 | Morris | G11C 11/419 | 365/156 |
| 2017/0012628 A1* | 1/2017 | Blutman | H03K 19/018514 | |
| 2017/0093403 A1* | 3/2017 | Wilson | H03K 19/018528 | |
| 2017/0110585 A1* | 4/2017 | Takahashi | H03K 17/56 | |
| 2017/0126215 A1* | 5/2017 | Crandall | H03K 17/04 | |
| 2017/0126236 A1* | 5/2017 | Gu | H04L 7/0016 | |
| 2017/0338823 A1* | 11/2017 | Reinhold | G01R 19/16585 | |

* cited by examiner

LEVEL SHIFTER

RELATED APPLICATIONS

This application claims priority under 35 U.S.C. § 119 to Japanese Patent Application No. 2017-022483 filed on Feb. 9, 2017, the entire content of which is hereby incorporated by reference.

BACKGROUND OF THE INVENTION

1. Field of the Invention

The present invention relates to a level shifter configured to convert an input voltage to a voltage at a different level.

2. Description of the Related Art

FIG. 4 is a circuit diagram for illustrating a related-art level shifter 400 (for example, see Japanese Patent Application Laid-open No. 2001-036398).

The related-art level shifter 400 includes NMOS transistors 401 and 402, and PMOS transistors 411 and 412. The level shifter 400 is configured to respectively receive, at gates of the NMOS transistors 401 and 402, a non-inverted signal and an inverted signal of an input signal IN having an amplitude between a reference voltage VSS that is supplied to a power supply line 41 and a power supply voltage VDD1 that is supplied to a power supply line 42, and convert the input signal IN to a signal having an amplitude between the reference voltage VSS and a power supply voltage VDD2 that is supplied to a power supply line 43, to thereby output the resultant signal as an output signal OUT.

In such a related-art level shifter 400, when input-side power supply is stopped due to some causes or when the rise of an input-side power supply voltage (power supply voltage VDD1) delays at start-up of power supply, the gate voltages of the NMOS transistors 401 and 402 become undefined and the output signal OUT thus becomes undefined, leading to a problem, for example that a through current flows through a circuit on a subsequent stage of the level shifter 400 which operates with the output signal OUT.

As measures against the problem, in Japanese Patent Application Laid-open No. 2013-187712, there is disclosed a level shifter in which a feedback circuit part (170) is added. The feedback circuit part (170) is configured to maintain the logic of an output signal when input-side power supply is not supplied.

The level shifter disclosed in Japanese Patent Application Laid-open No. 2013-187712, however, needs an unignorable number of additional elements (six additional NMOS transistors in FIG. 1 of Japanese Patent Application Laid-open No. 2013-187712) to configure the feedback circuit part for maintaining the logic of the output signal, as compared to the number of elements of the related-art level shifter 400. This means that the scale of the circuit is large and cost is high.

SUMMARY OF THE INVENTION

It is an object of the present invention to provide a level shifter capable of preventing the level of an output signal from becoming undefined even when an input-side power supply is stopped or when the rise of an input-side power supply voltage delays at start-up of power supply while suppressing an increase in the circuit scale.

In one embodiment of the present invention, there is provided a level shifter configured to convert an input signal having an amplitude between a first power supply voltage that is supplied to a first power supply line and a second power supply voltage that is supplied to a second power supply line to a signal having an amplitude between the first power supply voltage and a third power supply voltage that is supplied to a third power supply line so as to output the converted signal, the level shifter including: a non-inverting output node at which a non-inverted signal of the converted signal is generated; an inverting output node at which an inverted signal of the converted signal is generated; a first MOS transistor of a first conductivity type configured to receive a non-inverted signal of the input signal at a gate thereof and including a source connected to the first power supply line and a drain connected to the inverting output node; a second MOS transistor of the first conductivity type configured to receive an inverted signal of the input signal at a gate thereof and including a source connected to the first power supply line and a drain connected to the non-inverting output node; a third MOS transistor of a second conductivity type including a gate connected to the non-inverting output node, a source connected to the third power supply line, and a drain connected to the inverting output node; a fourth MOS transistor of the second conductivity type including a gate connected to the inverting output node, a source connected to the third power supply line, and a drain connected to the non-inverting output node; a fifth MOS transistor of the first conductivity type including a gate connected to the non-inverting output node, a source connected to the first power supply line, and a drain connected to the inverting output node; and a sixth MOS transistor of the first conductivity type including a gate connected to the inverting output node, a source connected to the first power supply line, and a drain connected to the non-inverting output node.

According to the present invention, when the input-side power supply is stopped or when the rise of the input-side power supply voltage delays at start-up of power supply, the third and fourth MOS transistors and the fifth and sixth MOS transistors serve as a latch circuit, and hence it is possible to maintain the level of the output signal or fix the level of the output signal to a certain level. Further, the above-mentioned effects can be achieved by the configuration including the only two transistors (fifth and sixth MOS transistors) in addition to the components of the related-art level shifter, and hence a great increase in scale of the circuit and an increase in cost can be prevented.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will be now described herein with reference to illustrative embodiments.

First Embodiment

Figure 1:
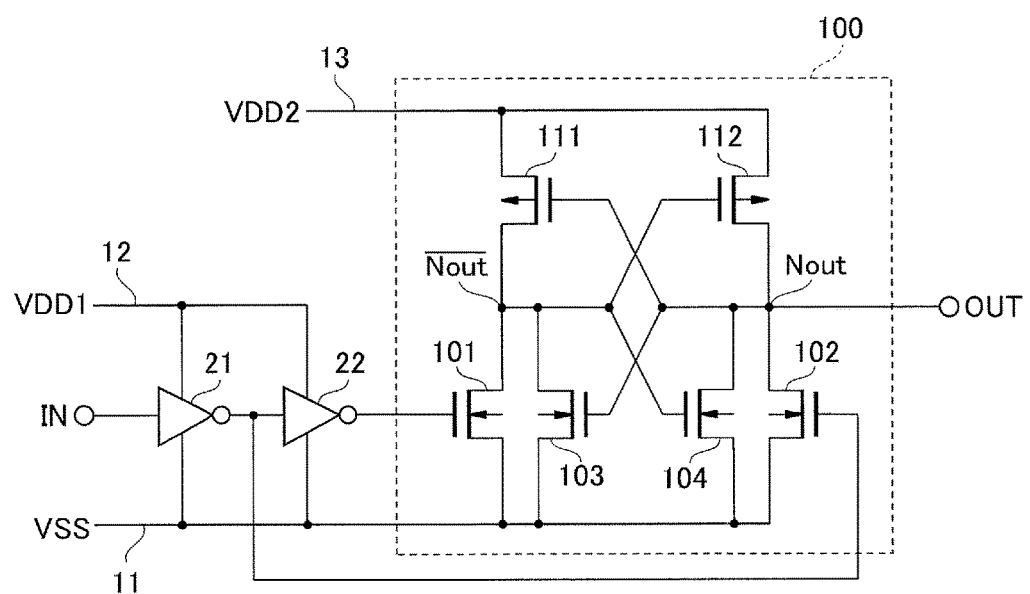
FIG. 1 is a circuit diagram for illustrating a level shifter according to a first embodiment of the present invention.

FIG. 1 is a circuit diagram for illustrating a level shifter 100 according to a first embodiment of the present invention.

The level shifter 100 is configured to convert an input signal IN having an amplitude between a reference voltage VSS (also referred to as "first power supply voltage") that is supplied to a power supply line 11 and a power supply voltage VDD1 (also referred to as "second power supply voltage") that is supplied to a power supply line 12 to a signal having an amplitude between the reference voltage VSS and a power supply voltage VDD2 (also referred to as "third power supply voltage") that is supplied to a power supply line 13, to thereby output the converted signal as an output signal OUT.

The level shifter 100 includes NMOS transistors 101, 102, 103, and 104, and PMOS transistors 111 and 112.

The NMOS transistor 101 is configured to receive a non-inverted signal of the input signal IN at its gate via inverters 21 and 22, and has a source connected to the power supply line 11, and a drain connected to an inverting output node /Nout at which an inverted signal of the converted signal is generated. The NMOS transistor 102 is configured to receive an inverted signal of the input signal IN at its gate via the inverter 21, and has a source connected to the power supply line 11, and a drain connected to a non-inverting output node Nout at which a non-inverted signal of the converted signal is generated. The PMOS transistor 111 has a gate connected to the non-inverting output node Nout, a source connected to the power supply line 13, and a drain connected to the inverting output node /Nout. The PMOS transistor 112 has a gate connected to the inverting output node /Nout, a source connected to the power supply line 13, and a drain connected to the non-inverting output node Nout. The NMOS transistor 103 has a gate connected to the non-inverting output node Nout, a source connected to the power supply line 11, and a drain connected to the inverting output node /Nout. The NMOS transistor 104 has a gate connected to the inverting output node /Nout, a source connected to the power supply line 11, and a drain connected to the non-inverting output node Nout.

Now, the operation of the level shifter 100 having the above-mentioned configuration is described.

When the input signal IN at a level of the power supply voltage VDD1 (first high level) is input, a non-inverted signal of the input signal IN is input to the gate of the NMOS transistor 101 via the inverters 21 and 22. Meanwhile, an inverted signal of the input signal IN is input to the gate of the NMOS transistor 102 via the inverter 21. Consequently, the NMOS transistor 101 is turned on, and the NMOS transistor 102 is turned off.

Then, a voltage at the inverting output node /Nout decreases to a level of the reference voltage VSS (low level). Consequently, the PMOS transistor 112 is turned on, and the NMOS transistor 104 is turned off. Then, a voltage at the non-inverting output node Nout increases to a level of the power supply voltage VDD2 (second high level). Consequently, the PMOS transistor 111 is turned off, and the NMOS transistor 103 is turned on.

Through the above-mentioned operation, the output signal OUT becomes the level of the power supply voltage VDD2 (second high level).

When the input signal IN at a level of the reference voltage VSS (low level) is input, a non-inverted signal of the input signal IN is input to the gate of the NMOS transistor 101 via the inverters 21 and 22. Meanwhile, an inverted signal of the input signal IN is input to the gate of the NMOS transistor 102 via the inverter 21. Consequently, the NMOS transistor 101 is turned off, and the NMOS transistor 102 is turned on.

Then, the voltage at the non-inverting output node Nout decreases to the level of the reference voltage VSS (low level). Consequently, the PMOS transistor 111 is turned on, and the NMOS transistor 103 is turned off. Then, the voltage at the inverting output node /Nout increases to the level of the power supply voltage VDD2 (second high level). Consequently, the PMOS transistor 112 is turned off, and the NMOS transistor 104 is turned on.

Through the above-mentioned operation, the output signal OUT becomes the level of the reference voltage VSS (low level).

In this way, the level shifter 100 converts the input signal IN having an amplitude between the reference voltage VSS and the power supply voltage VDD1 to the signal having an amplitude between the reference voltage VSS and the power supply voltage VDD2.

Next, how the level shifter 100 operates when input-side power supply is stopped due to some causes is described.

When the input-side power supply is stopped due to some causes under a state in which the input signal IN at the level of the power supply voltage VDD1 (first high level) is input and the output signal OUT is the level of the power supply voltage VDD2 (second high level) as described above, the voltage input to the gate of the NMOS transistor 101 decreases from the level of the power supply voltage VDD1. When a gate-source voltage of the NMOS transistor 101 falls below a threshold voltage thereof, the NMOS transistor 101 is turned off.

Under this state, the NMOS transistors 101 and 102 are both in off-state. Hence the PMOS transistor 111 and the NMOS transistor 103 serve as an inverter having an input connected to the non-inverting output node Nout and an output connected to the inverting output node /Nout, and the PMOS transistor 112 and the NMOS transistor 104 serve as an inverter having an input connected to the inverting output node /Nout and an output connected to the non-inverting output node Nout. Those two inverters serve as a latch circuit. As a result, the latch circuit latches the output signal OUT, and it is thus possible to maintain the output signal OUT at the level of the power supply voltage VDD2 (second high level).

Further, when the input-side power supply is stopped under a state in which the input signal IN at the level of the reference voltage VSS (low level) is input and the output signal OUT is the level of the reference voltage VSS (low level), the voltage input to the gate of the NMOS transistor 102 decreases from the level of the power supply voltage VDD1. When a gate-source voltage of the NMOS transistor 102 falls below a threshold voltage thereof, the NMOS transistor 102 is turned off.

Under this state, the NMOS transistors 101 and 102 are both in off-state. Hence the PMOS transistors 111 and 112 and the NMOS transistors 103 and 104 serve as a latch circuit, as in the case described above. As a result, it is possible to maintain the output signal OUT at the level of the reference voltage VSS (low level).

Next, how the level shifter 100 operates when the rise of the input-side power supply voltage (power supply voltage VDD1) delays at start-up of power supply is described.

Under a state in which the power supply voltage VDD1 does not rise, the reference voltage VSS is input to both of the gates of the NMOS transistors 101 and 102, and the NMOS transistors 101 and 102 are thus both turned off. As a result, the PMOS transistors 111 and 112 and the NMOS transistors 103 and 104 serve as a latch circuit, as in the case described above.

The latch circuit is configured to latch a voltage that is generated at the non-inverting output node Nout depending on the rising state of the power supply voltage VDD2 at the start-up of the power supply, fixing the output signal OUT to the latched voltage. It is therefore possible to prevent the output signal OUT from becoming undefined.

In this way, according to the first embodiment, when the input-side power supply is stopped, a level of the output signal OUT immediately before the input-side power supply is stopped can be maintained. Further, when the rise of the input-side power supply voltage delays at the start-up of the power supply, the output signal OUT can be fixed to a certain level.

In the first embodiment, the level shifter 100 can operate without problems when the power supply voltages satisfy the relationship of VDD1>VDD2>VSS or when the power supply voltages satisfy VDD2>VDD1>VSS and the power supply voltage VDD2 is larger than the power supply voltage VDD1 only slightly.

A case considered now is a case in which the power supply voltages satisfy the relationship of VDD2>VDD1>VSS and the power supply voltage VDD2 is much larger than the power supply voltage VDD1. In the case, when the input signal IN changes from the level of the power supply voltage VDD1 (first high level) to the level of the reference voltage VSS (low level), under a state in which the PMOS transistor 112 is in on-state, the NMOS transistor 102 is also turned on. At this time, a voltage applied to the gate of the NMOS transistor 102 is the power supply voltage VDD1 which is lower than the power supply voltage VDD2. Hence, as compared to the current supply capacity of the PMOS transistor 112, the NMOS transistor 102 has a low current supply capacity, that is, a low capacity of reducing the voltage at the non-inverting output node Nout. As a result, the voltage at the non-inverting output node Nout does not decrease to the level of the reference voltage VSS, and the level shifting operation of the level shifter 100 is consequently stopped.

A similar situation occurs also when the input signal IN changes from the level of the reference voltage VSS (low level) to the level of the power supply voltage VDD1 (first high level).

In order to avoid such a situation, it is preferred that a current supply capacity from the power supply line 13 to the inverting output node Nout is lower than the current supply capacity of the NMOS transistor 101 and a current supply capacity from the power supply line 13 to the non-inverting output node Nout is lower than the current supply capacity of the NMOS transistor 102.

As a specific example of measures against such a situation, the first embodiment may employ a configuration in which the current supply capacity of the PMOS transistor 111 is made smaller than that of the NMOS transistor 101 and the current supply capacity of the PMOS transistor 112 is made smaller than that of the NMOS transistor 102.

According to the configuration described above, even when the input signal IN changes from the level of the power supply voltage VDD1 (first high level) to the level of the reference voltage VSS (low level) and the PMOS transistor 112 and the NMOS transistor 102 are both turned on, the voltage at the non-inverting output node Nout can be caused to decrease to the level of the reference voltage VSS (low level), because the current supply capacity from the power supply line 13 to the non-inverting output node Nout is smaller than the current supply capacity of the NMOS transistor 102. It is therefore possible to prevent the stopping of the level shifting operation.

The above description deals with a specific example of the configuration in which, in order to prevent the stopping of the level shifting operation, the current supply capacity from the power supply line 13 to the inverting output node /Nout is set lower than the current supply capacity of the NMOS transistor 101 and the current supply capacity from the power supply line 13 to the non-inverting output node Nout is set lower than the current supply capacity of the NMOS transistor 102. Now, specific examples that differ from the above-mentioned example are described as second and third embodiments of the present invention.

Second Embodiment

Figure 2:
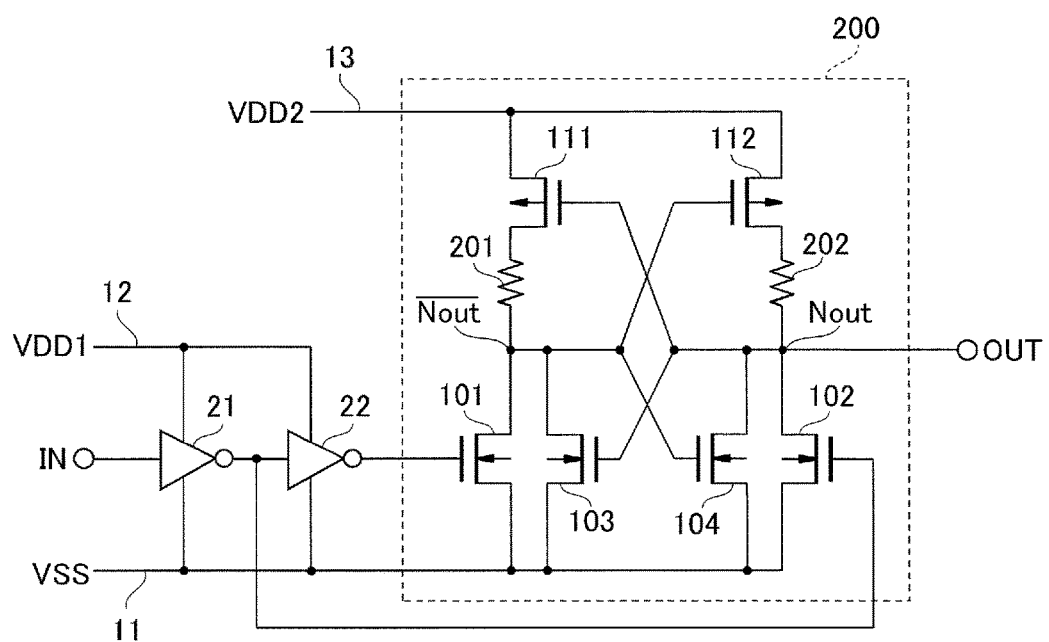
FIG. 2 is a circuit diagram for illustrating a level shifter according to a second embodiment of the present invention.

FIG. 2 is a circuit diagram for illustrating a level shifter 200 according to a second embodiment of the present invention. The same components as those of the level shifter 100 of the first embodiment, which is illustrated in FIG. 1, are denoted by the same reference symbols, and redundant description is omitted as appropriate.

The level shifter 200 of the second embodiment includes, in addition to the components of the level shifter 100 of the first embodiment, a resistor 201 connected between the PMOS transistor 111 and the inverting output node /Nout, and a resistor 202 connected between the PMOS transistor 112 and the non-inverting output node Nout. The remaining configuration of the level shifter 200 is the same as that of the level shifter 100.

According to the configuration described above, the same effects as those of the level shifter 100 of the first embodiment are obtained. Specifically, when the input-side power supply is stopped, a level of the output signal OUT immediately before the input-side power supply is stopped can be maintained, and when the rise of the input-side power supply voltage delays at the start-up of the power supply, the output signal OUT can be fixed to a certain level. In addition, due to the provision of the resistors 201 and 202 on current paths from the power supply line 13 to the power supply line 11, the current supply capacity from the power supply line 13 to the inverting output node /Nout can be made lower than the current supply capacity of the NMOS transistor 101, and the current supply capacity from the power supply line 13 to the non-inverting output node Nout can be made lower than the current supply capacity of the NMOS transistor 102.

According to the second embodiment, unlike the example described in the first embodiment, it is not necessary that the PMOS transistor 111 have a current supply capacity different from that of the NMOS transistor 101 and the PMOS transistor 112 have a current supply capacity different from that of the NMOS transistor 102. Hence, designing of the level shifter 200 is easy, which is an advantage.

Third Embodiment

Figure 3:
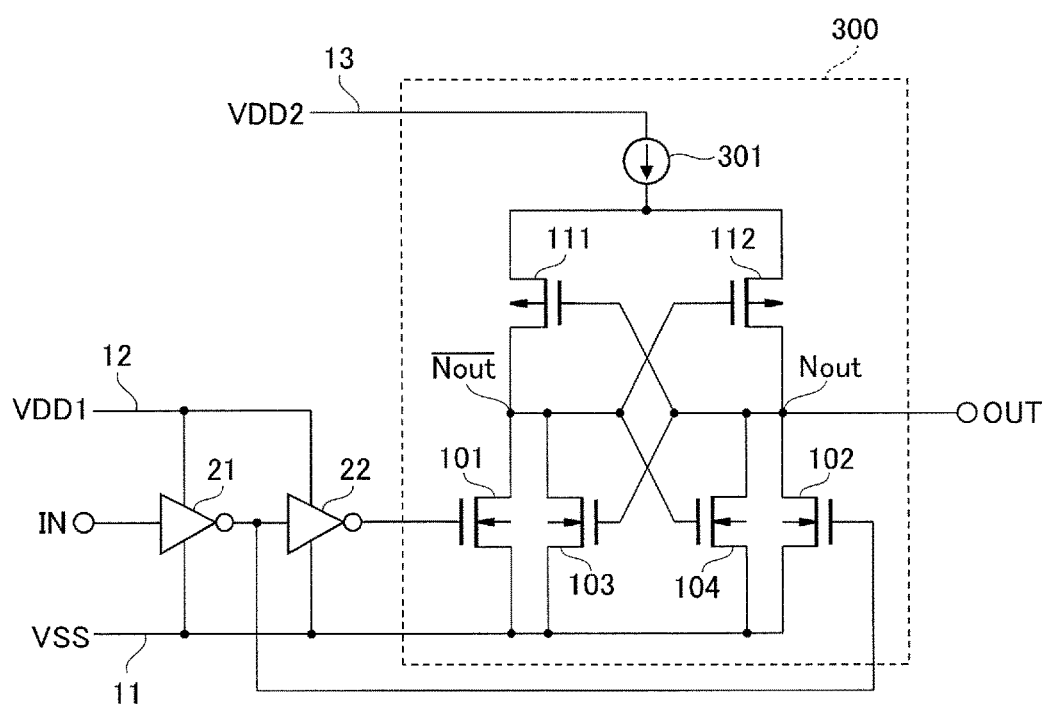
FIG. 3 is a circuit diagram for illustrating a level shifter according to a third embodiment of the present invention.
Figure 4:
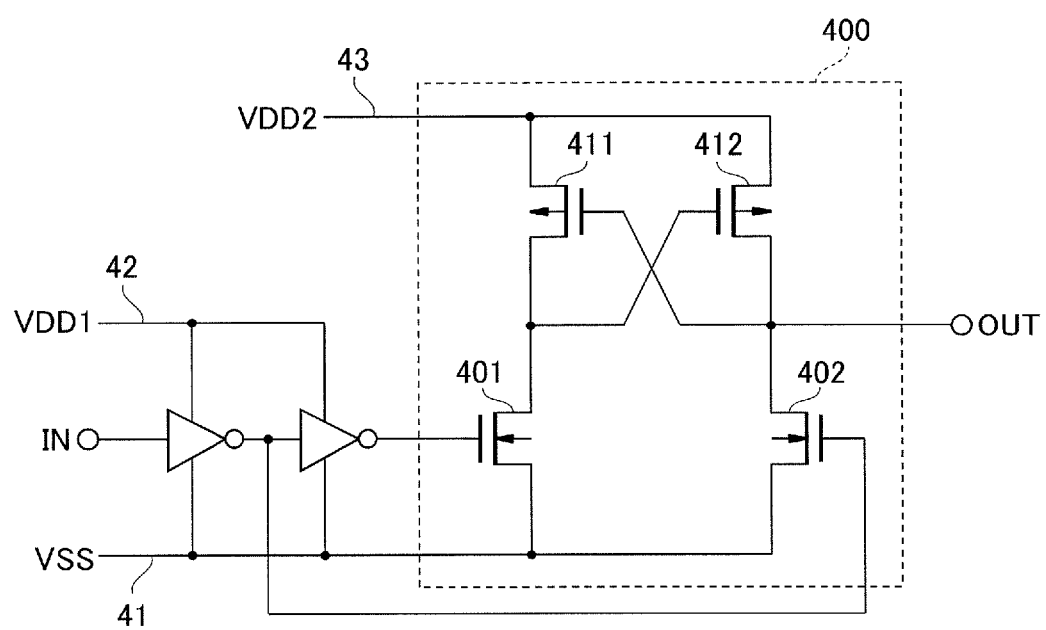
FIG. 4 is a circuit diagram for illustrating a related-art level shifter.

FIG. 3 is a circuit diagram for illustrating a level shifter 300 according to a third embodiment of the present invention. The same components as those of the level shifter 100 of the first embodiment, which is illustrated in FIG. 1, are denoted by the same reference symbols, and redundant description is omitted as appropriate.

The level shifter 300 of the third embodiment includes, in addition to the components of the level shifter 100 of the first embodiment, a constant current source 301 connected between the power supply line 13 and the sources of the PMOS transistors 111 and 112. The remaining configuration of the level shifter 300 is the same as that of the level shifter 100.

Also according to the configuration described above, the same effects as those of the level shifter 100 of the first embodiment are obtained. In addition, due to the provision of the constant current source 301 between the power supply line 13 and the sources of the PMOS transistors 111 and 112, the current supply capacity from the power supply line 13 to the inverting output node /Nout can be made lower than the current supply capacity of the NMOS transistor 101, and the current supply capacity from the power supply line 13 to the non-inverting output node Nout can be made lower than the current supply capacity of the NMOS transistor 102.

Also according to the third embodiment, similarly to the second embodiment, it is not necessary that the PMOS transistor 111 have a current supply capacity different from that of the NMOS transistor 101 and the PMOS transistor 112 have a current supply capacity different from that of the NMOS transistor 102. Hence, designing of the level shifter 300 is easy.

It is apparent that the present invention is not limited to the above embodiments, but may be modified and changed without departing from the scope and spirit of the invention.

For example, the above-mentioned embodiments may employ a circuit configuration in which the polarities of the PMOS transistors and the NMOS transistors are inverted.

What is claimed is:

1. A level shifter configured to convert an input signal having an amplitude between a first power supply voltage that is supplied to a first power supply line and a second power supply voltage that is supplied to a second power supply line to a signal having an amplitude between the first power supply voltage and a third power supply voltage that is supplied to a third power supply line so as to output a converted signal, the level shifter comprising:
    a non-inverting output node at which a non-inverted signal of the converted signal is generated;
    an inverting output node at which an inverted signal of the converted signal is generated;
    a first MOS transistor of a first conductivity type configured to receive a non-inverted signal of the input signal at a gate thereof and including a source connected to the first power supply line and a drain connected to the inverting output node;
    a second MOS transistor of the first conductivity type configured to receive an inverted signal of the input signal at a gate thereof and including a source connected to the first power supply line and a drain connected to the non-inverting output node;
    a third MOS transistor of a second conductivity type including a gate connected to the non-inverting output node, a source connected to the third power supply line, and a drain connected to the inverting output node;
    a fourth MOS transistor of the second conductivity type including a gate connected to the inverting output node, a source connected to the third power supply line, and a drain connected to the non-inverting output node;
    a fifth MOS transistor of the first conductivity type including a gate connected to the non-inverting output node, a source connected to the first power supply line, and a drain connected to the inverting output node; and
    a sixth MOS transistor of the first conductivity type including a gate connected to the inverting output node, a source connected to the first power supply line, and a drain connected to the non-inverting output node.

2. The level shifter according to claim 1, wherein a current supply capacity from the third power supply line to the inverting output node is lower than a current supply capacity of the first MOS transistor, and a current supply capacity from the third power supply line to the non-inverting output node is lower than a current supply capacity of the second MOS transistor.

3. The level shifter according to claim 1, wherein a current supply capacity of the third MOS transistor is lower than a current supply capacity of the first MOS transistor, and a current supply capacity of the fourth MOS transistor is lower than a current supply capacity of the second MOS transistor.

4. The level shifter according to claim 2, wherein a current supply capacity of the third MOS transistor is lower than a current supply capacity of the first MOS transistor, and a current supply capacity of the fourth MOS transistor is lower than a current supply capacity of the second MOS transistor.

5. The level shifter according to claim 1, further comprising:
    a first resistor connected between the third MOS transistor and the inverting output node; and
    a second resistor connected between the fourth MOS transistor and the non-inverting output node.

6. The level shifter according to claim 2, further comprising:
    a first resistor connected between the third MOS transistor and the inverting output node; and
    a second resistor connected between the fourth MOS transistor and the non-inverting output node.

7. The level shifter according to claim 1, further comprising a constant current source connected between the third power supply line and the sources of the third and fourth MOS transistors.

8. The level shifter according to claim 2, further comprising a constant current source connected between the third power supply line and the sources of the third and fourth MOS transistors.

* * * * *